United States Patent
Hussein et al.

(10) Patent No.: US 7,923,760 B2
(45) Date of Patent: *Apr. 12, 2011

(54) DIELECTRIC SPACERS FOR METAL INTERCONNECTS AND METHOD TO FORM THE SAME

(75) Inventors: Makarem A. Hussein, Beaverton, OR (US); Boyan Boyanov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/630,771

(22) Filed: Dec. 3, 2009

(65) Prior Publication Data

US 2010/0071941 A1 Mar. 25, 2010

Related U.S. Application Data

(63) Continuation of application No. 11/429,165, filed on May 4, 2006, now Pat. No. 7,649,239.

(51) Int. Cl.
*H01L 23/48* (2006.01)
*H01L 21/70* (2006.01)
*H01L 29/40* (2006.01)

(52) U.S. Cl. ............... 257/276; 257/522; 257/758

(58) Field of Classification Search .......... 257/276, 257/522, 758
See application file for complete search history.

(56) References Cited

U.S. PATENT DOCUMENTS

| 5,759,913 A | 6/1998 | Fulford et al. |
| 5,876,798 A | 3/1999 | Vassiliev |
| 5,982,035 A | 11/1999 | Tran et al. |
| 6,064,118 A | 5/2000 | Sasaki |
| 6,191,027 B1 | 2/2001 | Omura |
| 6,252,290 B1 | 6/2001 | Quek et al. |
| 6,255,224 B1 | 7/2001 | Kim |
| 6,265,321 B1 * | 7/2001 | Chooi et al. ............. 438/725 |
| 6,303,404 B1 | 10/2001 | Moon et al. |
| 6,303,464 B1 | 10/2001 | Gaw et al. |
| 6,362,073 B2 * | 3/2002 | Kim ................... 438/422 |
| 6,368,939 B1 * | 4/2002 | Sasaki ................. 438/421 |
| 6,423,630 B1 | 7/2002 | Catabay et al. |
| 6,440,839 B1 * | 8/2002 | Partovi et al. ............ 438/619 |
| 6,472,266 B1 | 10/2002 | Yu et al. |
| 6,489,195 B1 | 12/2002 | Hwang et al. |
| 6,495,445 B2 | 12/2002 | Clevenger |
| 6,577,011 B1 * | 6/2003 | Buchwalter et al. ......... 257/758 |
| 6,737,725 B2 | 5/2004 | Grill et al. |
| 6,888,244 B2 * | 5/2005 | Engelhardt et al. ......... 257/750 |
| 6,897,508 B2 | 5/2005 | Sneh |

(Continued)

FOREIGN PATENT DOCUMENTS

| JP | 14050686 | 2/2002 |
| KR | 1020010003760 | 1/2001 |
| KR | 1020050057784 | 6/2005 |

OTHER PUBLICATIONS

U.S. Appl. No. 11/429,165, filed May 4, 2006, Hussein, , et al.

(Continued)

*Primary Examiner* — Matthew C Landau
*Assistant Examiner* — James M Mitchell
(74) *Attorney, Agent, or Firm* — Blakely, Sokoloff, Taylor & Zafman LLP

(57) ABSTRACT

A plurality of metal interconnects incorporating dielectric spacers and a method to form such dielectric spacers are described. In one embodiment, the dielectric spacers adjacent to neighboring metal interconnects are discontiguous from one another. In another embodiment, the dielectric spacers may provide a region upon which un-landed vias may effectively land.

18 Claims, 12 Drawing Sheets

U.S. PATENT DOCUMENTS

| | | | |
|---|---|---|---|
| 6,995,073 | B2 | 2/2006 | Liou |
| 7,030,005 | B2 | 4/2006 | Lee |
| 7,042,095 | B2 | 5/2006 | Noguchi et al. |
| 7,312,512 | B2 | 12/2007 | Lu et al. |
| 7,358,594 | B1 | 4/2008 | Allman et al. |
| 7,393,776 | B2 | 7/2008 | Colburn et al. |
| 7,473,632 | B2 | 1/2009 | Ueda |
| 7,579,233 | B2 | 8/2009 | Hwang |
| 7,649,239 | B2 * | 1/2010 | Hussein et al. ............... 257/522 |
| 2001/0040267 | A1 * | 11/2001 | Lien et al. ..................... 257/522 |
| 2001/0051423 | A1 | 12/2001 | Kim et al. |
| 2002/0127844 | A1 | 9/2002 | Grill et al. |
| 2002/0140101 | A1 | 10/2002 | Yang et al. |
| 2003/0183940 | A1 | 10/2003 | Noguchi et al. |
| 2004/0084774 | A1 | 5/2004 | Li et al. |
| 2004/0121577 | A1 | 6/2004 | Yu et al. |
| 2004/0266167 | A1 | 12/2004 | Dubin et al. |
| 2005/0062165 | A1 * | 3/2005 | Saenger et al. ............... 257/774 |
| 2005/0079700 | A1 | 4/2005 | Schindler et al. |
| 2005/0184397 | A1 * | 8/2005 | Gates et al. ................... 257/774 |
| 2005/0272256 | A1 * | 12/2005 | Wang ............................ 438/637 |
| 2005/0285269 | A1 | 12/2005 | Cao et al. |
| 2006/0063373 | A1 | 3/2006 | Gambino et al. |
| 2006/0170110 | A1 | 8/2006 | Akram et al. |
| 2006/0197230 | A1 | 9/2006 | Anezaki et al. |
| 2007/0257368 | A1 | 11/2007 | Hussein et al. |
| 2008/0108219 | A1 | 5/2008 | Huebinger et al. |
| 2008/0166870 | A1 * | 7/2008 | Huang et al. .................. 438/619 |

OTHER PUBLICATIONS

International Search Report and Written Opinion from PCTUS2007/010484 mailed Nov. 8, 2007, 10 pgs.

International Search Report and Written Opinion from PCT/US2007/020443 mailed Jan. 25, 2008, 9 pgs.

International Preliminary Report on Patentability from PCT/US2007/010484 mailed Nov. 13, 2008, 6 pgs.

Non-Final Office Action for U.S. Appl. No. 11/525,709, Mailed Apr. 2, 2009, 22 pages.

International Preliminary Report on Patentability from PCT/US2007/020443 mailed Apr. 2, 2009, 5 pgs.

Final Office Action from U.S. Appl. No. 11/429,165 mailed May 27, 2009, 13 pgs.

Non-Final Office Action for U.S. Appl. No. 11/525,709, Mailed Oct. 14, 2009, 27 Pages.

Office Action from German Patent Application No. 112007002215.9-43 mailed May 28, 2009, 2 pgs.

International Search Report and Written Opinion from PCT/US2007/020443 Mailed Jan. 25, 2008, 9 Pages.

Non-Final Office Action for U.S. Appl. No. 11/429,165, Mailed Oct. 8, 2008, 17 Pages.

Official GPTO Communication for German Patent Application Nu. 112007002215.9-43 Mailed May 28, 2009, 2 Pages.

Chan, Kelvin , et al., "Air-Gap Fabrication Using a Sacrificial Polymeric Thin Film Synthesized Via Initiated Chemical Vapor Deposition", Journal of Electrochemical Society, vol. 153, No. 4, (2006), C223-228.

Noguchi, Junji , et al., "Process and Reliability of Air-Gap Cu Interconnect Using 90-nm Node Technology", IEEE Transactions on Electron Devices, vol. 52, No. 3, (Mar. 2005), 352-359.

Office Action from Chinese Application No. 200780031072.0 mailed Dec. 11, 2009, 4 pages.

* cited by examiner

DIELECTRIC SPACERS FOR METAL INTERCONNECTS AND METHOD TO FORM THE SAME

CROSS-REFERENCE TO RELATED APPLICATIONS

This application is a continuation of U.S. Patent Application No. 11/429,165, filed May 4, 2006, the entire contents of which are hereby incorporated by reference herein.

BACKGROUND OF THE INVENTION

1) Field of the Invention

The invention is in the field of Integrated Circuits.

2) Description of Related Art

Metal interconnects are utilized in the fabrication of integrated circuits as a means of connecting various electronic and semiconductor devices into a global circuitry. Two key factors considered when fabricating such metal interconnects are the resistance (R) of each metal interconnect and the coupling capacitance (C), i.e. cross-talk, generated between metal interconnects. Both of these factors hamper the efficiency of metal interconnects. Thus, it has been desirable to reduce both the resistance and the capacitance in metal interconnects in order to mitigate the so called "RC-delay."

For the past decade, the performance of integrated circuits, such as those found on microprocessors, has been greatly enhanced by the incorporation of copper interconnects into the "back-end" of line processing sequence. The presence of such copper interconnects, versus aluminum interconnects, greatly reduces the resistance of such interconnects lending to their improved conduction and efficiency.

Attempts to reduce the coupling capacitance generated between metal interconnects have included the use of low-K (2.5-4) dielectric layers that house the metal interconnects, where K is the dielectric constant of the dielectric layers. However, the incorporation of such films has proven to be challenging. Other attempts to reduce the coupling capacitance between metal interconnects has focused on "air-gap" technologies, where no dielectric layer exists between metal lines. Although this technique has been effective for reducing the coupling capacitance, a result of air having a K-value of only 1, the structural integrity of a plurality of metal interconnects may be compromised in the absence of supporting dielectric layers.

Thus, a method to mitigate the RC-delay in a plurality of metal interconnects is described herein.

DETAILED DESCRIPTION

Figure 1:
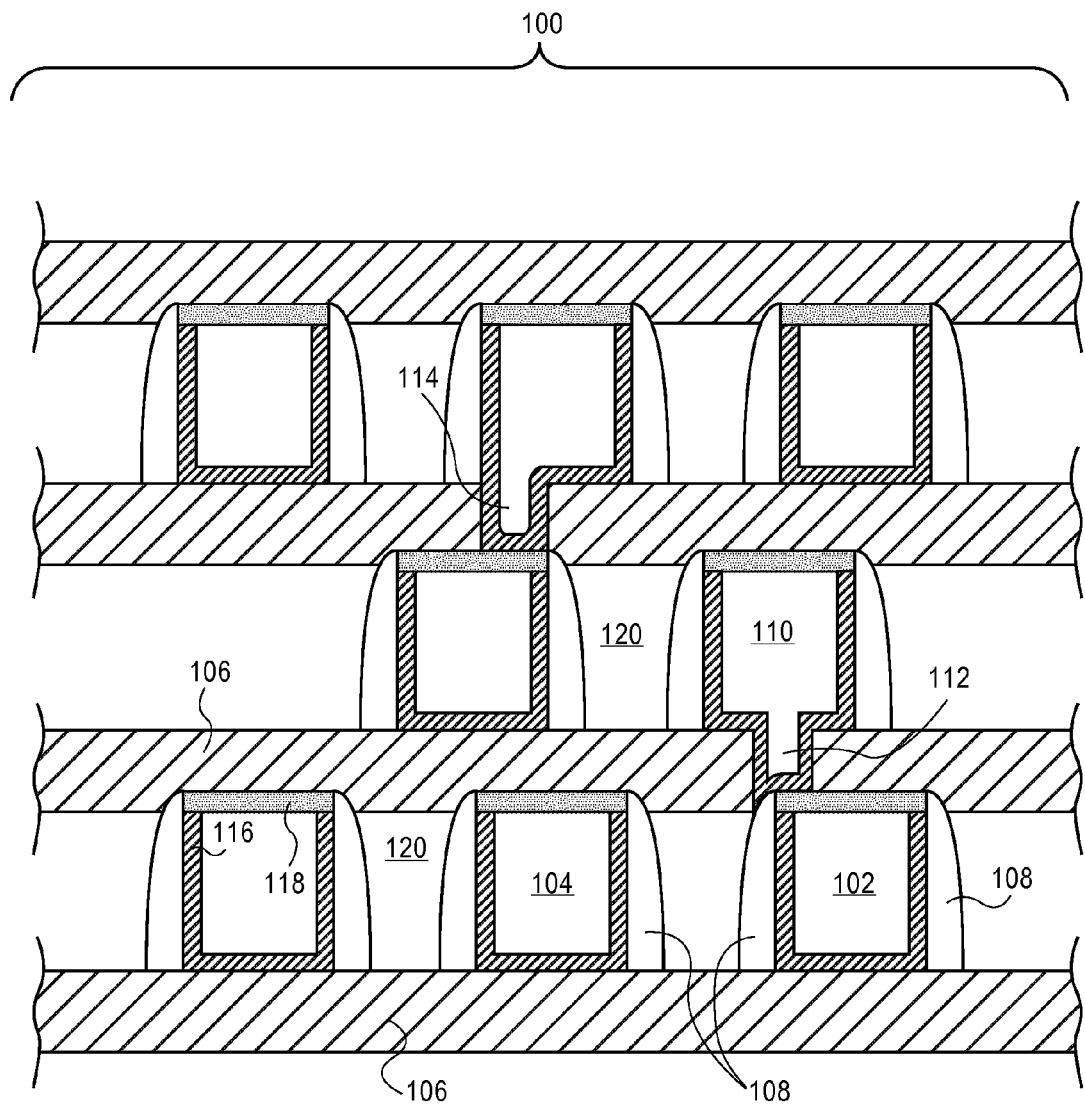
FIG. 1 illustrates a cross-sectional view of a plurality of interconnects with discontiguous spacers depicting a landed via and an un-landed via, in accordance with an embodiment of the present invention.

A plurality of metal interconnects with dielectric spacers for use in an integrated circuit and a process to fabricate such a plurality of metal interconnects with dielectric spacers are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps, are not described in detail, in order to not unnecessarily obscure the present invention. Furthermore, it is understood that the various embodiments shown in the figures are illustrative representations and are not necessarily drawn to scale.

Disclosed herein are dielectric spacers for metal interconnects and a method to form such dielectric spacers. Incorporating dielectric spacers adjacent to the sidewalls of metal interconnects may lead to a relatively low coupling capacitance between various metal interconnects, may provide physical support for a plurality of interconnects and their connecting vias, and may provide a region onto which un-landed vias may reside. Thus, an "air-gap" metal interconnect architecture that provides sufficient integrity for incorporation into an integrated circuit and that provides a region onto which un-landed vias may "land" may be formed.

The use of dielectric spacers between metal interconnects may reduce the coupling capacitance, or "cross-talk", between such metal interconnects, and thus, dielectric spacers may be used to mitigate an "RC-delay" within a series of metal interconnects. Also, incorporating dielectric spacers between metal interconnects may enable the use of reduced dielectric constant materials (e.g. materials with a dielectric constant less than that of silicon dioxide) in the space between such metal interconnects, further reducing coupling capacitance. For example, low-K (dielectric constant of 2.5-4, where silicon dioxide is around 4) dielectric layers in between the metal interconnects may be utilized in conjunction with dielectric spacers. Furthermore, dielectric spacers may be used together with air-gaps (dielectric constant of 1) in between a series of metal interconnects to significantly reduce the capacitive coupling among metal interconnects. Including dielectric spacers between metal interconnects may enable the use of a dielectric layer only at the levels where the vias reside. Such an approach may be carried out without comprising the integrity of an electronic structure based on a plurality of metal interconnects.

When a dielectric spacer adjacent to a metal interconnect is discontiguous with a dielectric spacer adjacent to a neighboring metal interconnect, i.e. when they are not connected, the capacitive coupling between these metal interconnects may be significantly diminished. Thus, by breaking the continuity of a conformal film that covers a series of metal interconnects, i.e. forming discontiguous dielectric spacers on the sidewalls of the metal interconnects, the capacitive coupling path between metal interconnects may be broken, diminishing the RC-delay.

Dielectric spacers adjacent the sidewalls of metal interconnects may be used for the fabrication of an integrated circuit comprised of a plurality of metal interconnects. In accordance with an embodiment of the present invention, a plurality of metal interconnects 100 is formed, as shown in FIG. 1. Metal interconnects 102 and 104 may be spaced apart from one another and may sit above a dielectric layer 106. Metal interconnects 102 and 104 may comprise any suitable be material that can conduct a current from one end of a metal interconnect to another end of the metal interconnect. In one embodiment, metal interconnects 102 and 104 are comprised of copper, silver, aluminum or an alloy thereof. In another embodiment, metal interconnects 102 and 104 comprise an array of interspersed carbon nanotubes. Dielectric layer 106 may comprise any material suitable to provide structural integrity to the plurality of interconnects 100. In one embodiment, the dielectric constant of dielectric layer 106 is in the range of 2-5.5. In another embodiment, the dielectric constant of dielectric layer 106 is in the range of 2.5-4. In one embodiment, dielectric layer 106 is comprised of silicon dioxide, a silicate, or a carbon-doped oxide with 0-10% porosity.

Dielectric spacers 108 may reside adjacent the sidewalls of metal interconnects 102 and 104. In accordance with an embodiment of the present invention, dielectric spacers 108 are discontiguous with, i.e. not connected with, one another, as depicted in FIG. 1. Dielectric spacers 108 may be comprised of any material suitable to provide structural integrity to the plurality of interconnects 100. In an embodiment, dielectric spacers 108 are comprised of a material that can be etched with high selectivity. In one embodiment, the dielectric constant of dielectric spacers 108 is in the range of 3-7. In another embodiment, the dielectric constant of dielectric spacers is in between 4-6 and is greater than the dielectric constant of dielectric layer 106. In one embodiment, dielectric spacers 108 are comprised of silicon nitride, silicon carbide, nitrogen-doped silicon carbide, oxygen-doped silicon carbide, boron-doped carbon nitride or boron-doped silicon carbide. In another embodiment, spacers 108 are metal-based and comprised of CoW or CoWBP.

Referring to FIG. 1, a second level of interconnects may sit above a second dielectric layer 106, which in turn sits above metal interconnects 102 and 104. A third metal interconnect 110 may be connected to metal interconnect 102 by a via 112 that is housed by a dielectric layer 106. Dielectric spacers 108 may be of a width sufficient to provide a surface for via 112 to "land" in the case that via 112 is an un-landed via, as depicted in FIG. 1. In one embodiment, the width of dielectric spacers 108 is in the range of 5-20 nanometers. In another embodiment, via 112 is on a portion of the top surface of metal interconnect 102 and on a portion of the top surface of dielectric spacer 108. For comparison with un-landed via 112, a landed via 114 is depicted in FIG. 1, in accordance with an embodiment of the present invention.

The metal interconnects in structure 100 may comprise a barrier layer 116. Barrier layer 116 may comprise any material suitable to inhibit electro-migration within the metal interconnects, to prevent oxidation of the metal interconnects, or to provide a surface for nucleation in a damascene process. In one embodiment, barrier layer 116 is comprised of tantalum, titanium, tantalum nitride, titanium nitride or a combination thereof. In another embodiment, the thickness of barrier layer 116 is in the range of 50-150 Angstroms.

The metal interconnects in structure 100 may also comprise a capping layer 118. Capping layer 118 may comprise any material suitable to inhibit electro-migration within the metal interconnects, to prevent oxidation of the metal interconnects, or to protect the metal interconnects during formation of dielectric spacers 108. Capping layer 118 may also enable the use of oxygen-containing dielectric spacers 108. In one embodiment, capping layer 118 comprises iridium, ruthenium, cobalt, cobalt/tungsten alloy, cobalt/tungsten phosphide, cobalt boron phosphide or a combination thereof.

Referring to FIG. 1, because dielectric spacers 108 are discontiguous and not in contact with one another, a gap 120 may exist between the dielectric spacers 108 associated with neighboring metal interconnects 102 and 104. Gap 120 may be comprised of any suitable material or gas that enables a negligible capacitive coupling between metal interconnects 102 and 104. In one embodiment, gap 120 is comprised of air. In another embodiment, the dielectric constant of gap 120 is between 1 and 2.5. In another embodiment, gap 120 is comprised of a carbon-doped oxide with 25-40% porosity. In one embodiment, the dielectric constant of gap 120 is less than the dielectric constant of dielectric layer 106.

Gap 120 may be of a width sufficient to mitigate cross-talk between neighboring metal interconnects yet may be sufficiently narrow to block filling by upper dielectric layer 106 during the deposition of upper dielectric layer 106. In an embodiment, gap 120 is sufficiently wide to mitigate cross-talk between neighboring dielectric spacers 108. In one embodiment, the width of gap 120 is substantially equally to the width of dielectric spacer 108. In another embodiment, the width of gap 120 is in the range of 5-20 nanometers. In one embodiment, the width of gap 120 is approximately one third of the distance between neighboring metal interconnects.

Figure 2:
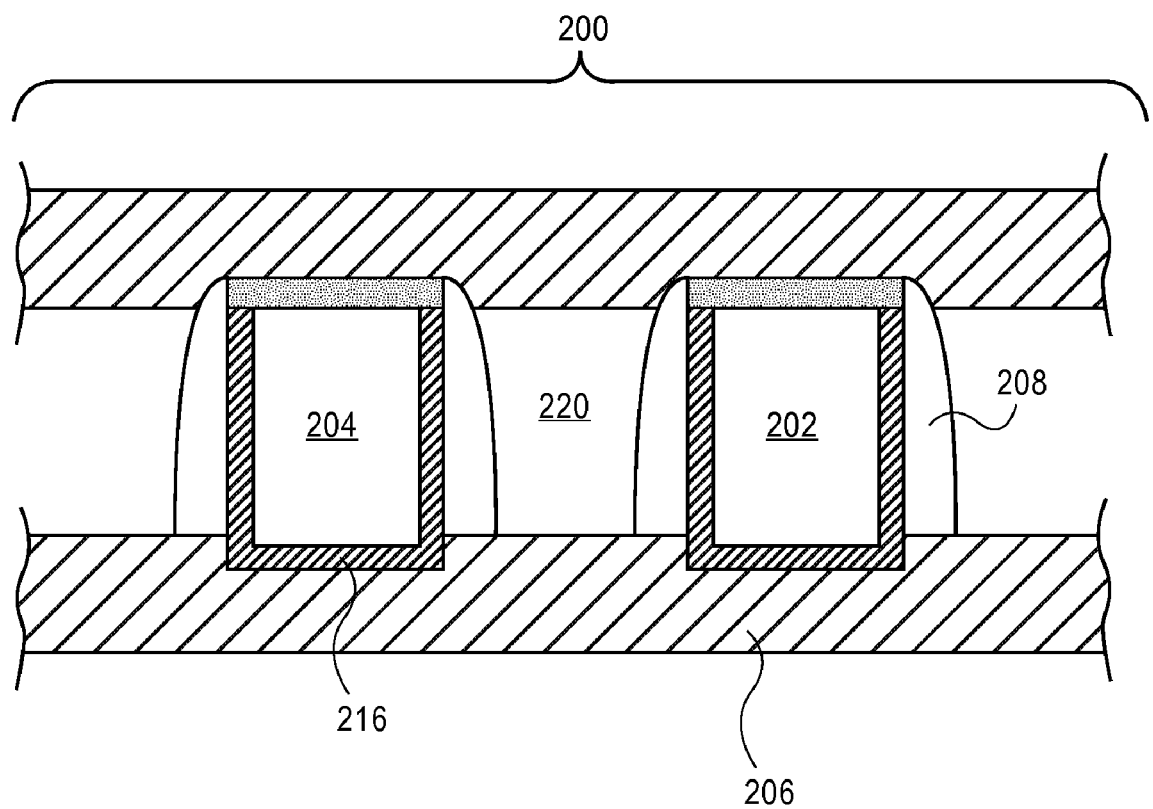
FIG. 2 illustrates a cross-sectional view of a pair of interconnects with discontiguous spacers, wherein the interconnects are recessed into the underlying dielectric layer, in accordance with an embodiment of the present invention.

A plurality of metal interconnects incorporating discontiguous dielectric spacers may require structural reinforcement. In accordance with an embodiment of the present invention, such metal interconnects are recessed into the underlying dielectric layer, thus "anchoring" the metal interconnects. Referring to FIG. 2, metal interconnects 202 and 204, which may comprise a barrier layer 216, are recessed into dielectric layer 206. Dielectric spacers 208 may not be recessed, but may still be discontiguous and separated by gap 220, as depicted in FIG. 2. In one embodiment, structure 200, comprising a plurality of metal interconnects, has an improved structural integrity resulting from the anchoring of metal interconnects 202 and 204. In another embodiment, recessed metal interconnects 202 and 204 are formed by a damascene process, where the recess into dielectric layer 206 is formed during damascene patterning step.

Figure 3:
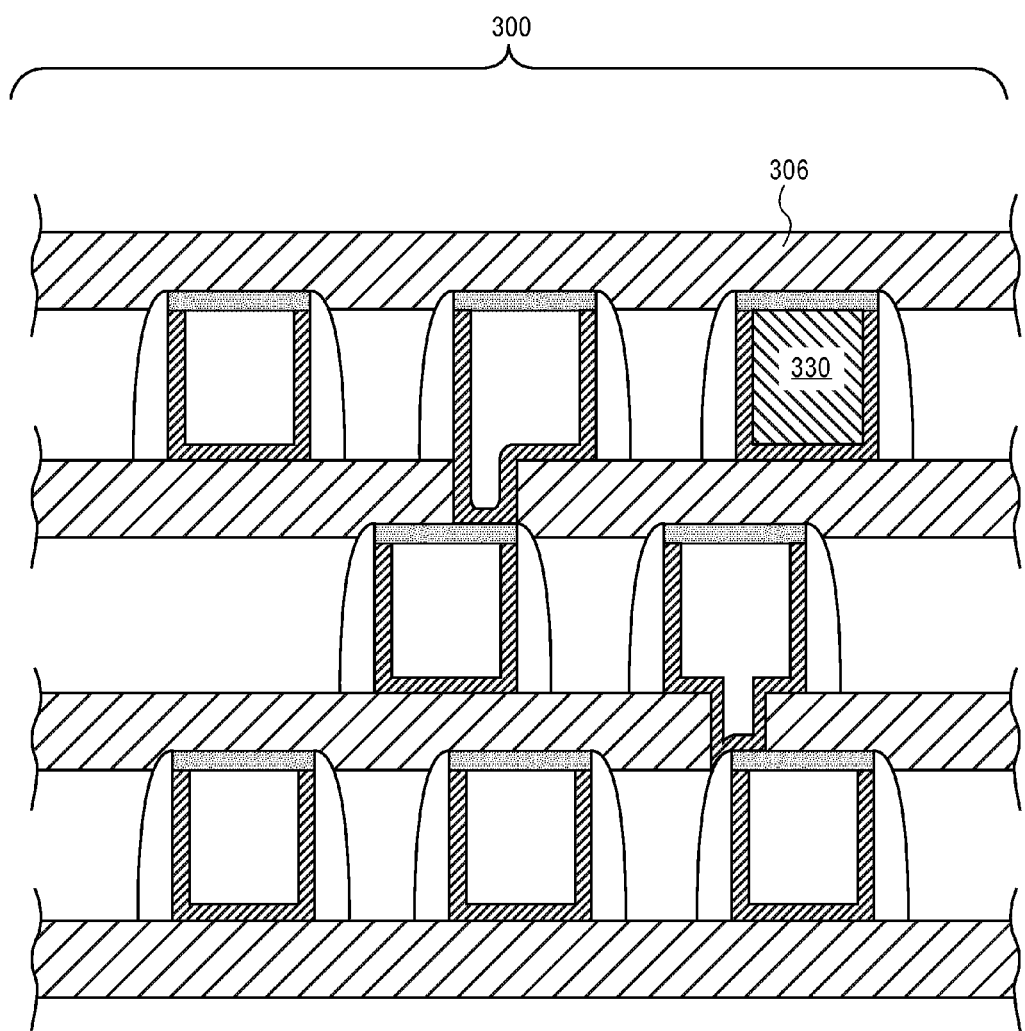
FIG. 3 illustrates a cross-sectional view of a plurality of interconnects with discontiguous spacers depicting a dummy interconnect, in accordance with an embodiment of the present invention.

A plurality of metal interconnects incorporating discontiguous dielectric spacers may comprise an architecture of active metal interconnects with a variable spacing. Such an architecture of various spacings between active metal interconnects may inhibit formation of a total air-gap architecture because the overlying dielectric layer may fill-in wider gaps and may thus increase the coupling capacitance between metal interconnects that are spaced further apart. In accordance with an embodiment of the present invention, a dummy metal interconnect, i.e. a metal interconnect that is not connected to the active portions of an integrated circuit, is used to maintain equal spacing between metal interconnects. Referring to FIG. 3, a plurality of metal interconnects 300 comprises a dummy metal interconnect 330. In one embodiment, dummy metal interconnect 330 blocks dielectric layer 306 from filling the gap between discontiguous dielectric spacers on neighboring active metal interconnects.

Figure 4:
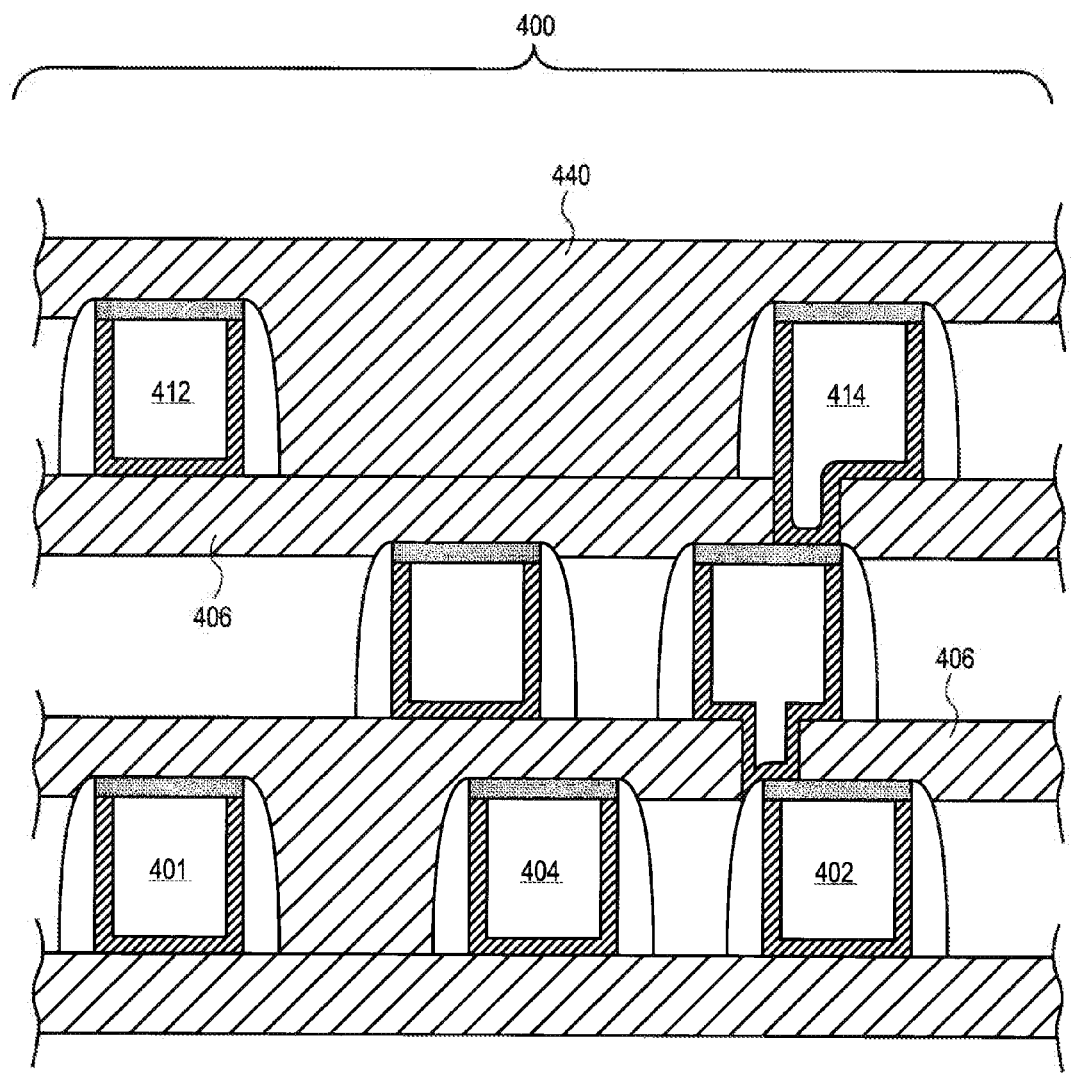
FIG. 4 illustrates a cross-sectional view of a plurality of interconnects with discontiguous spacers depicting a large spacing beside a metal interconnect that is filled with a dielectric layer, in accordance with an embodiment of the present invention.

Alternative to the structure associated with FIG. 3, a plurality of metal interconnects incorporating discontiguous dielectric spacers that comprises an architecture of active metal interconnects with a variable spacing may not incorporate dummy interconnects. In accordance with an embodiment of the present invention, the gap between discontiguous dielectric spacers associated with neighboring metal interconnects that are spaced further apart from one another is filled by an overlying dielectric layer. Referring to FIG. 4, neighboring metal interconnects 401 and 404, and also 412 and 414, are spaced further apart than neighboring metal interconnects 402 and 404. Dielectric layer 406, above metal interconnects 402 and 404 does not fill the gap between metal interconnects 402 and 404, while dielectric layer 406 above metal interconnects 401 and 404 fills the gap between metal interconnects 401 and 404, and dielectric layer 440 above metal interconnects 412 and 414 fills the gap between metal interconnects 412 and 414. In one embodiment, a gap with a width greater than the width of a dielectric spacer is filled by overlying dielectric layer 406 or by overlying dielectric layer 440. In accordance with an embodiment of the present invention, dielectric layer 406 or dielectric layer 440 is deposited to a thickness sufficient to fill a gap between metal interconnects 401 and 404 or between 412 and 414, respectively, wherein the width of the gap is greater than the width of a dielectric spacer, and a thickness sufficient to be subsequently polished to a flat surface above and in between metal interconnects 401 and 404 or 412 and 414, as depicted in FIG. 4. In accordance with another embodiment of the present invention, dielectric layer 406 or dielectric layer 440 is spun-on to a thickness sufficient to fill a gap between metal interconnects 401 and 404 or 412 and 414, respectively, wherein the width of the gap is greater than the width of a dielectric spacer, and a thickness sufficient to provide a flat surface above and in between metal interconnects 401 and 404 or 412 and 414, respectively, as depicted in FIG. 4.

Figure 5A:
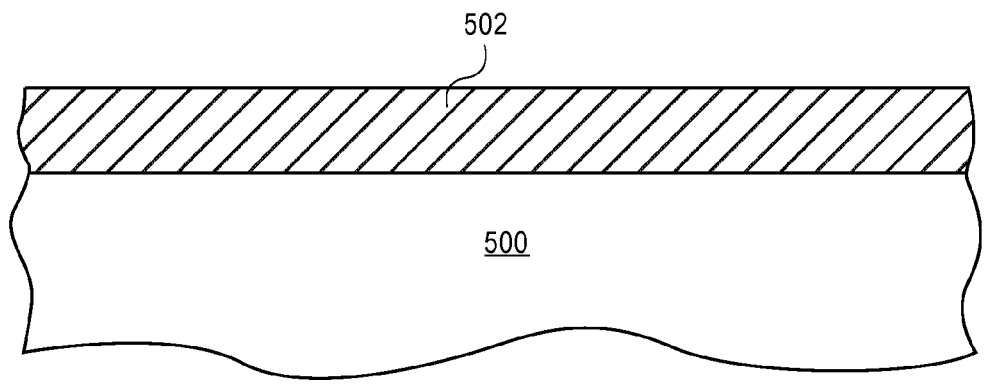
FIGS. 5A-J illustrate cross-sectional views representing the formation of a plurality of interconnects including the steps to form discontiguous dielectric spacers, in accordance with an embodiment of the present invention.

Dielectric spacers for metal interconnects may be fabricated by any suitable method such that the integrity of the metal interconnects and the underlying dielectric layer is maintained during formation of the dielectric spacers. In accordance with an embodiment of the present invention, FIGS. 5A-J illustrate the formation of discontiguous dielectric spacers for a plurality of metal interconnects in an integrated circuit. Referring to FIG. 5A, structure 500 may comprise a portion of a plurality of interconnects, a semiconductor substrate, or an array of semiconductor or electronic devices. In one embodiment, structure 500 is an array of complimentary metal-oxide-semiconductor (CMOS) transistors incased in a dielectric layer. Dielectric layer 502 is deposited above structure 500, as depicted in FIG. 5A. Dielectric layer 502 may be deposited by any suitable technique that provides substantially even coverage of dielectric layer 502 above structure 500. In one embodiment, dielectric layer 502 is deposited by a spin-on process, a chemical vapor deposition process, or a polymer-based chemical vapor deposition process. Dielectric layer 502 may comprise any suitable material that acts as a durable base for a plurality of metal interconnects with dielectric spacers. In one embodiment, dielectric layer 502 is comprised of silicon dioxide, a silicate, or a carbon-doped oxide with 0-10% porosity.

Figure 5B:
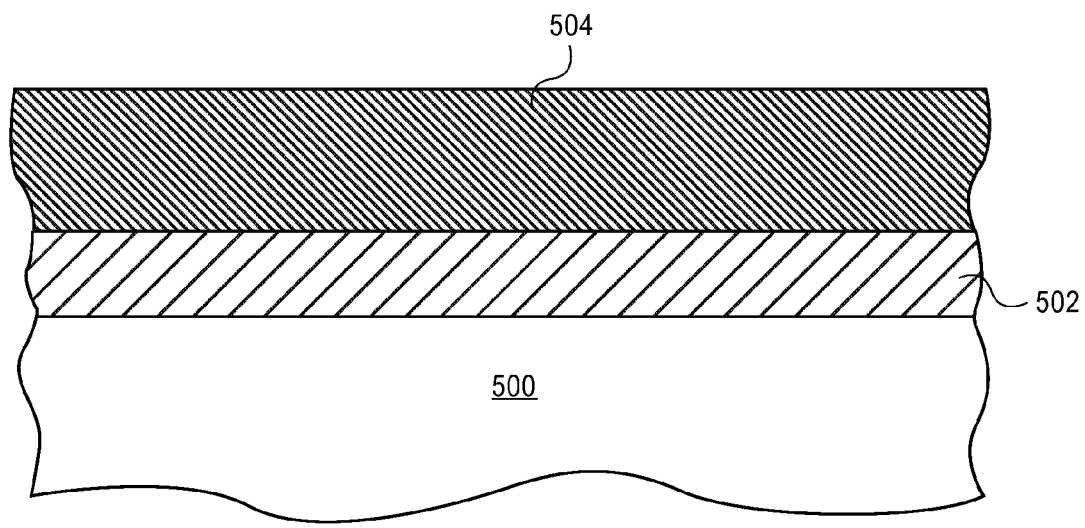
Figure 5C:
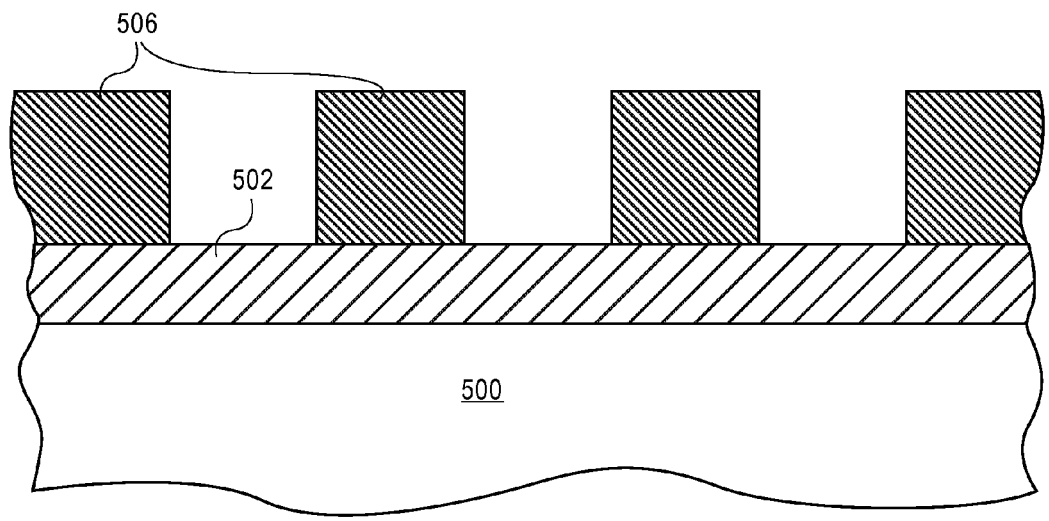
Figure 5D:
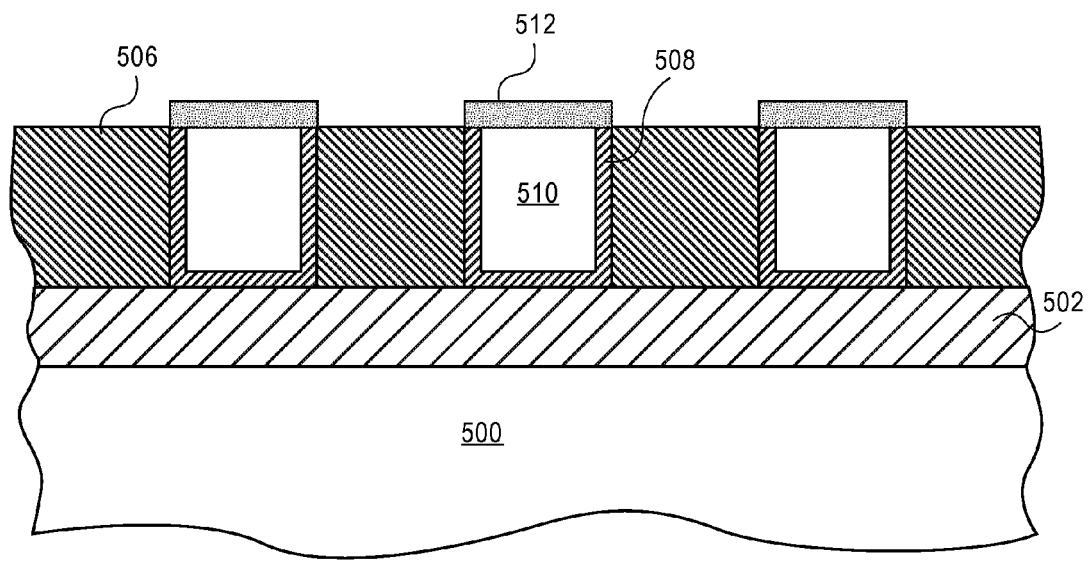

Metal interconnects may be formed above dielectric layer 502 by any suitable technique. In one embodiment, metal interconnects are formed by a subtractive etch process applied to a blanket metal film. In another embodiment, metal interconnects are formed by a damascene technique. Referring to FIGS. 5B-5D, a damascene technique using a sacrificial dielectric layer may be used to form metal interconnects. Sacrificial dielectric layer 504 may be deposited by any suitable technique that provides substantially even coverage of sacrificial dielectric layer 504 above dielectric layer 502, as depicted in FIG. 5B. In one embodiment, sacrificial dielectric layer 504 is deposited by a spin-on process, a chemical vapor deposition process, or a polymer-based chemical vapor deposition process. Sacrificial dielectric layer 504 may comprise any suitable material that may subsequently be removed without impacting dielectric layer 502 or the metal interconnect. In one embodiment, sacrificial dielectric layer 504 is comprised of a carbon-doped oxide with 20-35% porosity.

Referring to FIG. 5C, sacrificial dielectric layer 504 may be patterned to form patterned sacrificial dielectric layer 506, which exposes portions of dielectric layer 502. Metal interconnects 510 may then be formed in patterned sacrificial dielectric layer, above the exposed surfaces of dielectric layer 502, as depicted in FIG. 5D. Metal interconnects 510 may be formed by any suitable technique that fills the trenches formed in patterned sacrificial dielectric layer 506. In one embodiment, metal interconnects 510 are deposited by an electro-deposition process followed by a chemical-mechanical polish step. Metal interconnects 510 may comprise any suitable be material that can conduct a current from one end of a metal interconnect to another end of the metal interconnect. In one embodiment, metal interconnects 510 are comprised of copper, silver, aluminum or an alloy thereof. In another embodiment, metal interconnects 510 comprise an array of interspersed carbon nanotubes.

Metal interconnects 510 may comprise a barrier layer 508, as depicted in FIG. 5D. Barrier layer 508 may be deposited by any suitable technique that evenly lines the sidewalls and bottoms of the trenches formed in patterned sacrificial dielectric layer 506. In one embodiment, barrier layer 508 is deposited by an atomic layer deposition process, a chemical vapor deposition process or a physical vapor deposition process. Barrier layer 508 may comprise any material suitable to inhibit electro-migration within the metal interconnects 510, to prevent oxidation of the metal interconnects 510, or to provide a surface for nucleation in a damascene process. In one embodiment, barrier layer 508 is comprised of tantalum, titanium, tantalum nitride, titanium nitride or a combination thereof. In another embodiment, the thickness of barrier layer 508 is in the range of 50-150 Angstroms.

Metal interconnects 510 may also comprise a capping layer 512. Capping layer 512 may comprise any material suitable to inhibit electro-migration within the metal interconnects, to prevent oxidation of the metal interconnects, or to protect the metal interconnects during formation of dielectric spacers. Capping layer 512 may also enable the use of oxygen-containing dielectric spacers. In one embodiment, capping layer 512 comprises iridium, ruthenium, cobalt, cobalt/tungsten alloy, cobalt/tungsten phosphide, cobalt boron phosphide or a combination thereof.

Figure 5E:
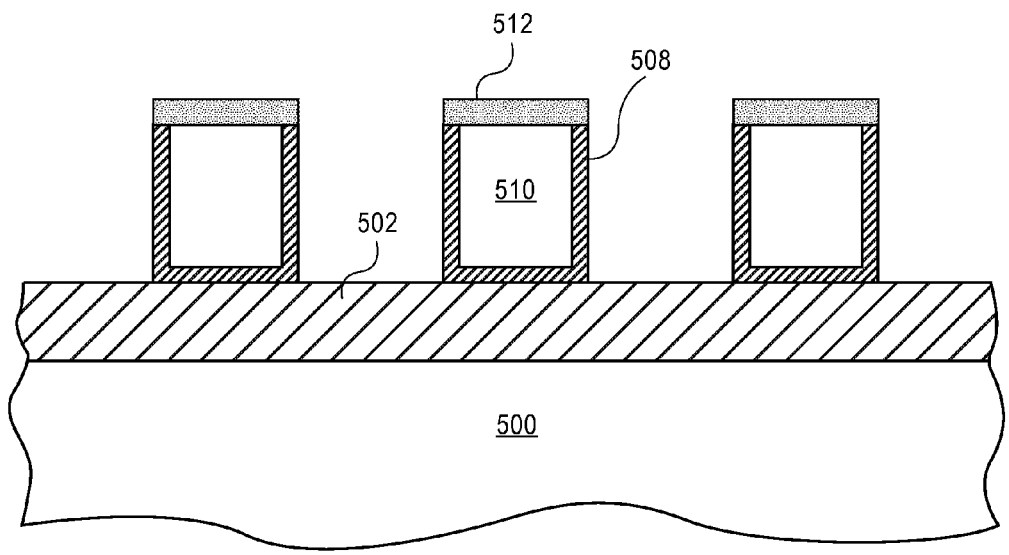

Patterned sacrificial dielectric layer 506 may be removed to provide free-standing metal interconnects 510, as depicted in FIG. 5E. Patterned sacrificial dielectric layer 506 may be removed by any suitable technique wherein the removal process does not impact dielectric layer 502 or metal interconnects 510. In accordance with one embodiment of the present invention, patterned sacrificial dielectric layer 506 is comprised of a carbon-doped oxide with 20-35% porosity, dielectric layer 502 is comprised of a carbon-doped oxide with 0-10% porosity, and patterned sacrificial dielectric layer 506 is removed with a wet etch chemistry that comprises 20-30% by volume of tetramethylammonium hydroxide.

Figure 5F:
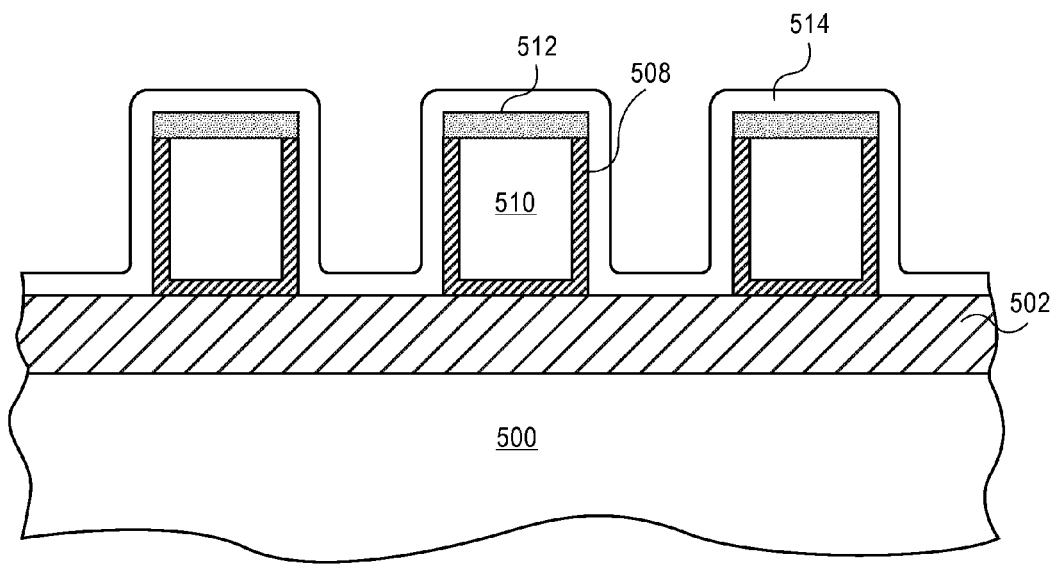

Referring to FIG. 5F, a spacer-forming dielectric layer 514 may be deposited conformally across metal interconnects 510 and above the exposed surfaces of dielectric layer 502. Spacer-forming dielectric layer 514 may be deposited by any suitable technique that renders a conformal or near conformal layer. Also, spacer-forming dielectric layer 514 may be deposited by any suitable technique that does not over-heat any electronic or semiconductor devices that may reside under the plurality of interconnects. In one embodiment, spacer-forming dielectric layer 514 is deposited at or below a temperature of 400° C. In another embodiment, spacer-forming dielectric layer 514 is deposited by atomic layer deposition or by chemical vapor deposition. Spacer-forming dielectric layer 514 may comprise any suitable dielectric material that may provide a surface onto which un-landed vias may "land." In one embodiment, spacer-forming dielectric layer 514 is comprised of silicon nitride, silicon carbide, nitrogen-doped silicon carbide, oxygen-doped silicon carbide, boron-doped carbon nitride or boron-doped silicon carbide. In another embodiment, spacer-forming dielectric layer 514 is comprised of a boron-doped carbon nitride layer, wherein said boron-doped carbon nitride layer is formed by reacting the gases methane, diborane, and ammonia. In one embodiment, the thickness of spacer-forming dielectric layer 514 determines the width of dielectric spacers 116, described below.

Figure 5G:
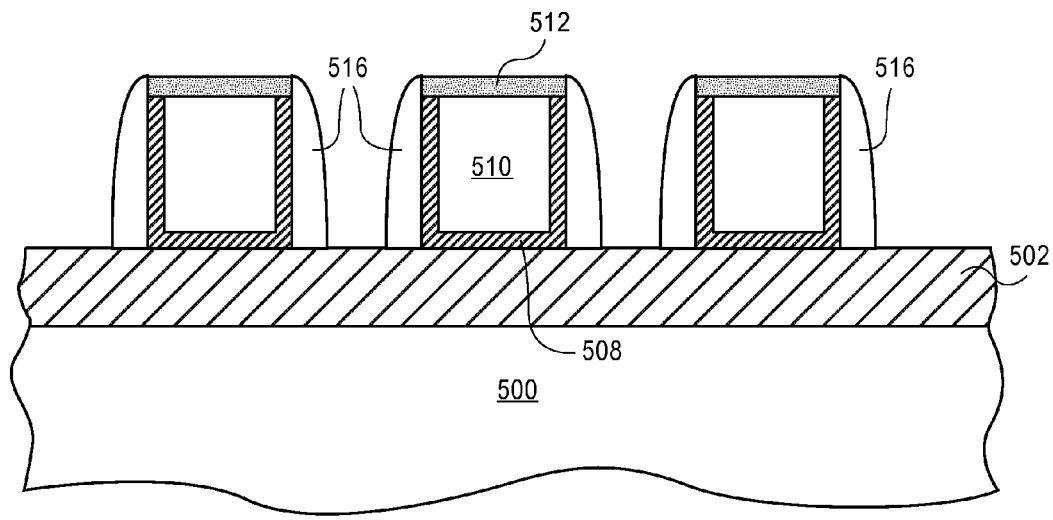

Spacer-forming dielectric layer 514 may be patterned to form discontiguous dielectric spacers 516, as depicted in FIG. 5G. Spacer-forming dielectric layer 514 may be patterned by any suitable technique that removes the portions of spacer-forming dielectric layer 514 from the top surface of metal interconnects 510, or their respective capping layers 512, and from the top surfaces of dielectric layer 502 that are exposed between metal interconnects 510. Thus, the portions of spacer-forming dielectric layer 514 that are adjacent to the sidewalls of metal interconnects 510, or their respective barrier layers 508, may be retained to form discontiguous dielectric spacers 516, as depicted in FIG. 5G. In one embodiment, spacer-forming dielectric layer 514 is patterned to form dielectric spacers 516 by using an anisotropic etch process. In another embodiment, spacer-forming dielectric layer 514 is patterned to form dielectric spacers 516 by using a vertical dry or plasma etch process comprising fluorocarbons of the general formula $C_xF_y$, where x and y are natural numbers. In another embodiment, spacer-forming dielectric layer 514 is patterned to form dielectric spacers 516 by using a vertical dry or plasma etch process comprising free radical fluorocarbons. In one embodiment, the width of dielectric spacers 116 is determined by the thickness of spacer-forming dielectric layer 514. In another embodiment, the anisotropic etch process is extended to remove a portion of dielectric layer 502.

Figure 5H:
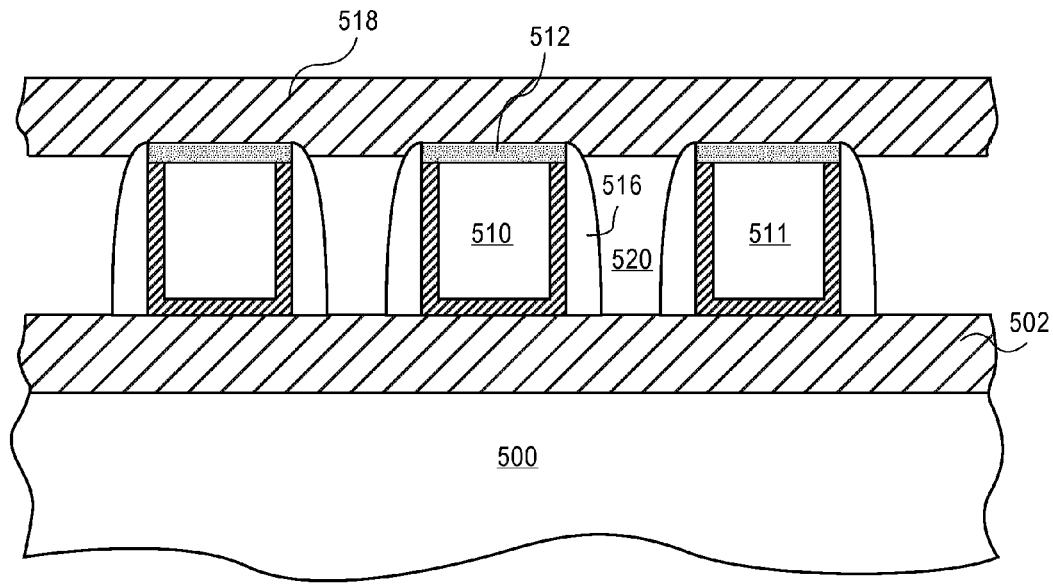

Referring to FIG. 5H, subsequent to forming dielectric spacers 516 on metal interconnects 510, dielectric layer 518 may be deposited above metal interconnects 510, or their respective capping layers 512, and above dielectric spacers 516. Dielectric layer 518 may be deposited by any suitable technique that provides substantially even coverage above metal interconnects 510 and 511 and above dielectric spacers 516 without substantially filling the space between dielectric spacers 516 from neighboring metal interconnects 510 and 511, as depicted in FIG. 5H. In one embodiment, dielectric layer 518 is deposited by a spin-on process, a chemical vapor deposition process, or a polymer-based chemical vapor deposition process. Dielectric layer 518 may comprise any suitable material that acts as a durable base for a new level of metal interconnects. In one embodiment, dielectric layer 518 is comprised of silicon dioxide, a silicate, or a carbon-doped oxide with 0-10% porosity.

A gap 520 may be formed between dielectric spacers 516 of neighboring metal interconnects 510 and 511 and between dielectric layers 502 and 518. Gap 520 may be comprised of any suitable material or gas that enables a negligible capacitive coupling between metal interconnects 510 and 511. In one embodiment, gap 520 is comprised of air. In another embodiment, gap 120 is comprised of a carbon-doped oxide with 25-40% porosity, as discussed in association with FIGS. 6A-C.

Figure 5I:
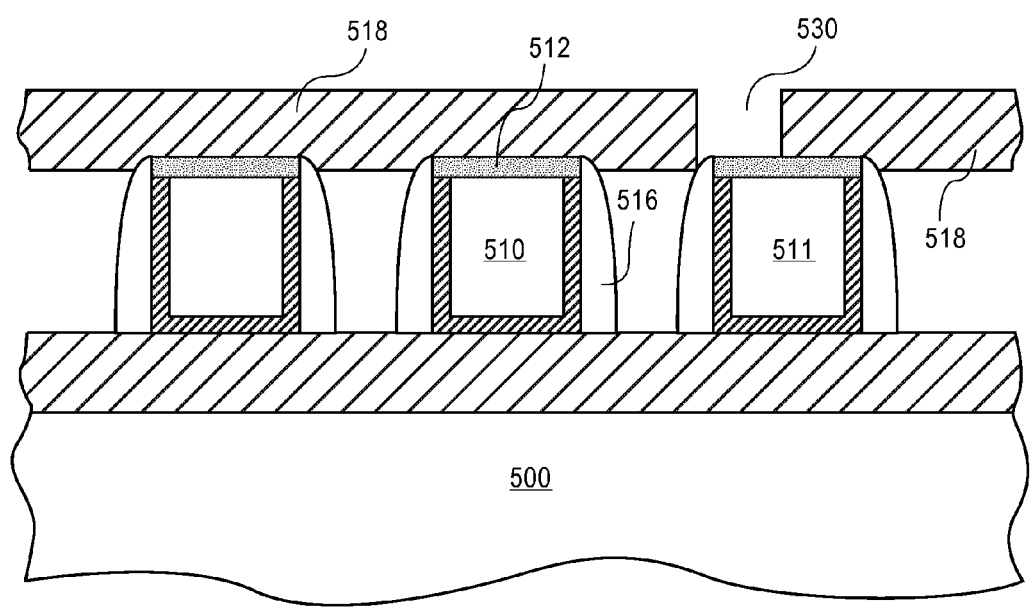
Figure 5J:
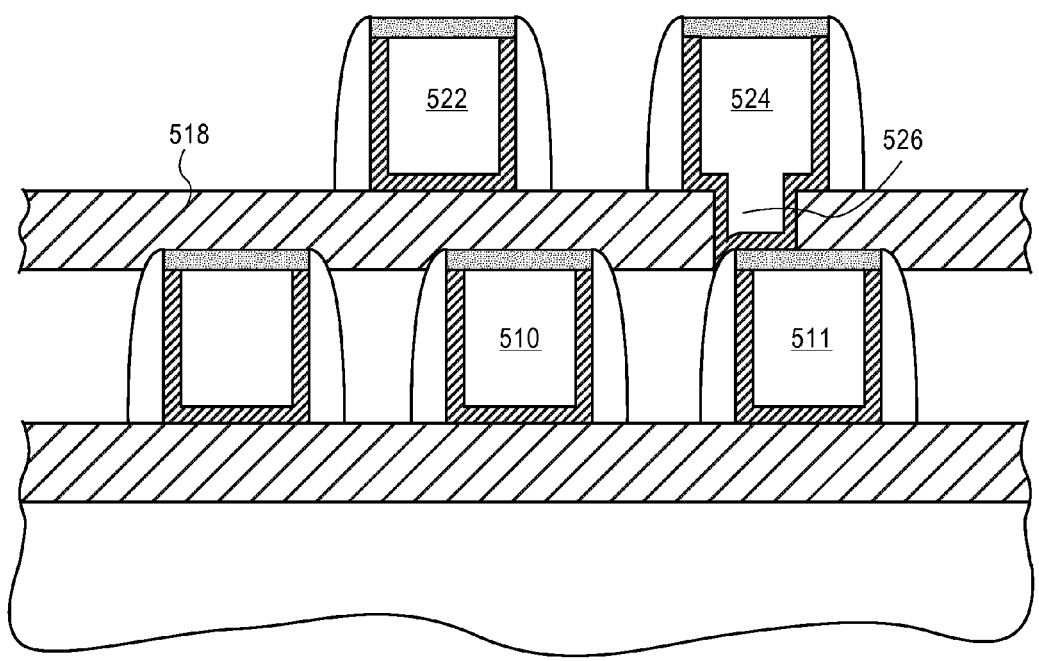

Referring to FIG. 5I, dielectric layer 518 may be patterned to form a via trench 530 above at least a portion of metal interconnect 511, or its respective capping layer 512. Any portion of via trench 530 that is not directly above the top surface of metal interconnect 511, or above its respective capping layer 512, may be above a portion of dielectric spacer 516. In accordance with an embodiment of the present invention, dielectric spacer 516 provides a surface onto which an un-landed via trench 530 can land, as depicted in FIG. 5I. Referring to FIG. 5J, a second level of metal interconnects 522 and 524 may be formed above dielectric layer 518. In accordance with an embodiment of the present invention, metal interconnect 524 are connected with underlying metal interconnect 511 by un-landed via 526. Thus, an "air-gap" metal interconnect architecture with discontiguous dielectric spacers to provide structural support for incorporation into an integrated circuit and to provide a region upon which un-landed vias may "land" may be formed.

Figure 6A:
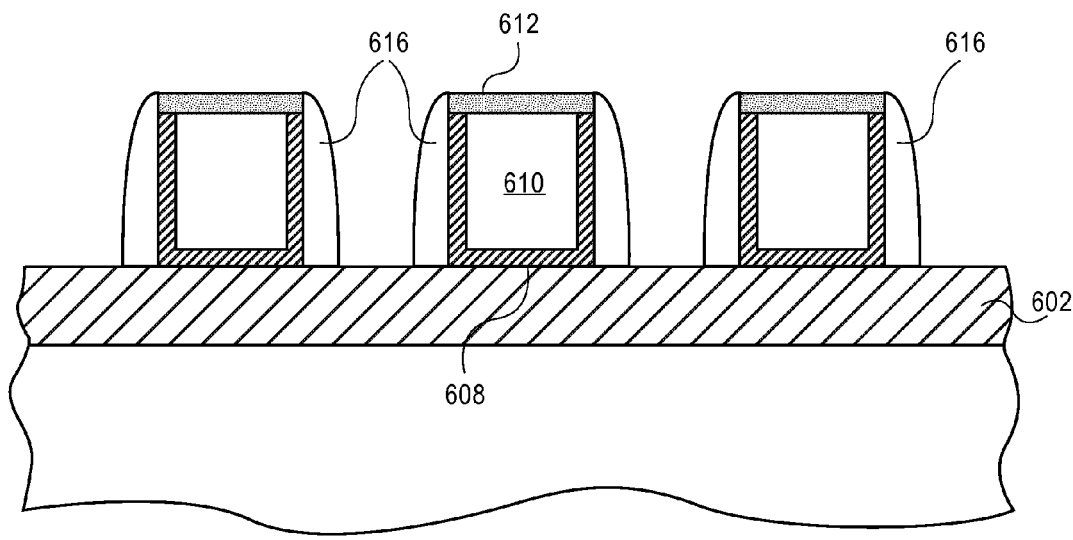
FIGS. 6A-C illustrate cross-sectional views representing the formation of a plurality of interconnects with discontiguous spacers, in accordance with an embodiment of the present invention.
Figure 6B:
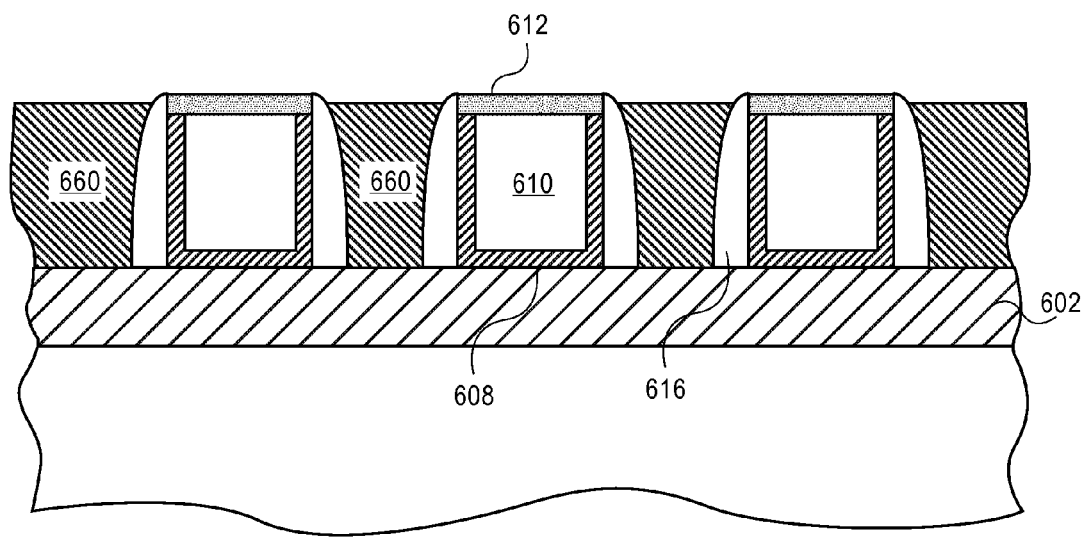
Figure 6C:
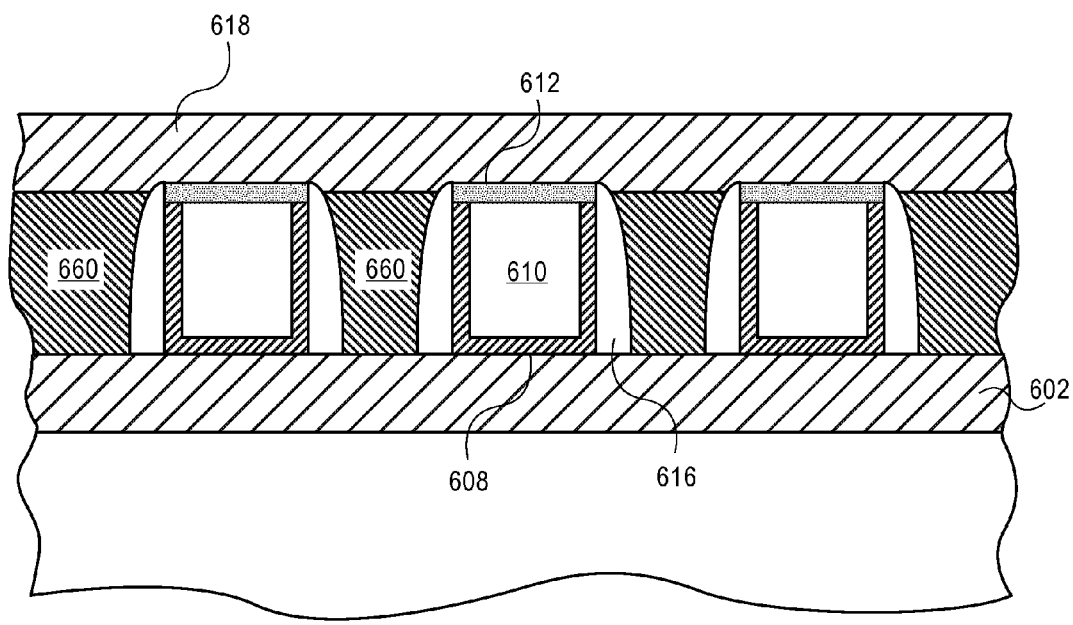

In accordance with another embodiment of the present invention, gap 520 from FIG. 5H may be filled with a material other than air, as illustrated in FIGS. 6A-C. Referring to FIG. 6B, an interstitial dielectric layer 660 may be deposited on the structure shown in FIG. 6A (which is analogous to the structure in FIG. 5G). Interstitial dielectric layer 660 may be comprised of any suitable material that enables a negligible capacitive coupling between metal interconnects 610. In one embodiment, the dielectric constant of interstitial dielectric layer 660 is between 1 and 2.5. In another embodiment, interstitial dielectric layer 660 is comprised of a carbon-doped oxide with 25-40% porosity. In one embodiment, the dielectric constant of interstitial dielectric layer 660 is less than the dielectric constant of dielectric layer 602. Dielectric layer 618 may then be deposited above metal interconnects 610, or their respective metal caps 612, above dielectric spacers 616 and above interstitial dielectric layer 660. In one embodiment, the dielectric constant of interstitial dielectric layer 660 is less than the dielectric constant of dielectric layer 618. Thus, an "ultra low-K gap" metal interconnect architecture with discontiguous dielectric spacers to provide structural support for incorporation into an integrated circuit and to provide a region upon which un-landed vias may "land" may be formed.

Figure 7:
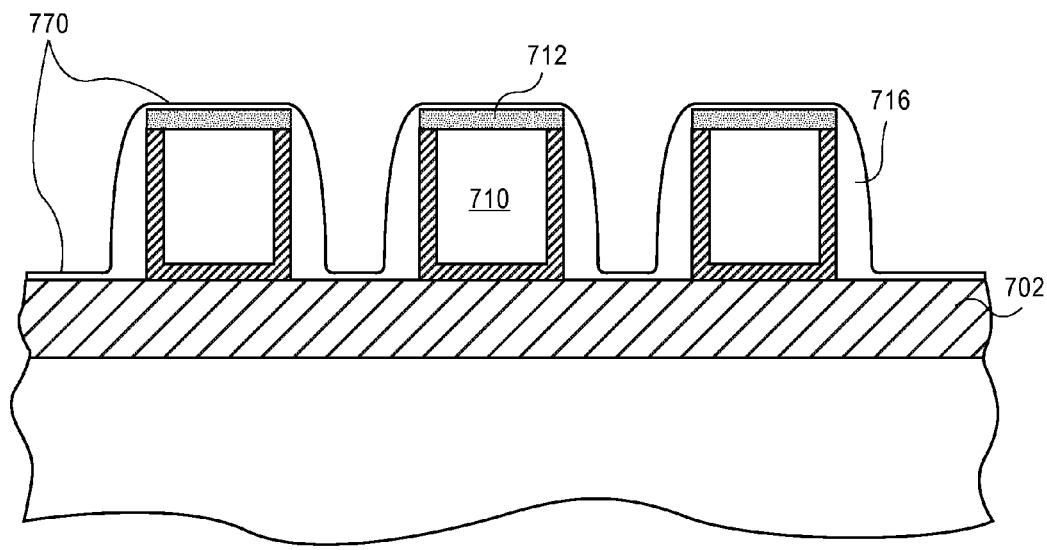
FIG. 7 illustrates a cross-sectional view of a plurality of interconnects with weakly contiguous dielectric spacers, in accordance with an embodiment of the present invention.

During the patterning of spacer-forming dielectric layer 514 to form dielectric spacers 516 (FIGS. 5F and 5G above), an incomplete etch process may leave residual portions of spacer-forming dielectric layer 514 above the metal interconnects and above the portions of the dielectric layer in between the dielectric spacers. In accordance with an embodiment of the present invention, incomplete patterning of the spacer-forming dielectric layer yields "weakly contiguous" dielectric spacers 716 and residual dielectric material 770 above dielectric layer 702 and above metal interconnects 710, as depicted in FIG. 7. Thus, an "air-gap" metal interconnect architecture with weakly contiguous dielectric spacers to provide structural support for incorporation into an integrated circuit and to provide a region upon which un-landed vias may "land" may be formed.

Although the foregoing embodiments contemplate discontiguous dielectric spacers for metal interconnects, the present invention is not limited to the use of metal interconnects. Conductive carbon nanotubes may be bundled together and used as interconnects to incorporate electronic or semiconducting devices into an integrated circuit. In accordance with another embodiment of the present invention, discontiguous dielectric spacers are used in conjunction with interconnects based on conductive carbon nanotubes. Thus, discontiguous dielectric spacers may be formed on the sidewalls of interconnects based on bundles of carbon nanotubes in order to reduce the RC-delay associated with such interconnects, to provide durability to the interconnect architecture, or to provide a surface onto which un-landed vias may land.

Thus, a plurality of metal interconnects incorporating dielectric spacers and a method to form such dielectric spacers have been described. In one embodiment, the dielectric spacers adjacent to neighboring metal interconnects are discontiguous from one another. In another embodiment, the dielectric spacers adjacent to neighboring metal interconnects are weakly contiguous with one another. In one embodiment, the dielectric spacers may provide a region upon which un-landed vias may effectively land.

What is claimed is:

1. An electronic structure with a plurality of interconnects, comprising:
   a first dielectric layer;
   a first interconnect;
   a second interconnect, wherein said second interconnect is spaced apart from said first interconnect, and wherein said first and said second interconnects are recessed into said first dielectric layer;
   a first dielectric spacer, wherein said first dielectric spacer is adjacent to a sidewall of said first interconnect, wherein said first dielectric spacer is in between said first and said second interconnects, and wherein said first dielectric spacer tapers outward, away from said sidewall of said first interconnect, from the top of said first interconnect to the bottom of said first interconnect;
   a second dielectric spacer, wherein said second dielectric spacer is adjacent to a sidewall of said second interconnect, wherein said second dielectric spacer is in between said first and said second interconnects, wherein said second dielectric spacer tapers outward, away from said sidewall of said second interconnect, from the top of said second interconnect to the bottom of said second interconnect, and wherein said first and said second dielectric spacers are discontiguous from one another with a gap in between said first and said second dielectric spacers; and
   a second dielectric layer, wherein said second dielectric layer is above said first and said second interconnects, wherein said second dielectric layer is above said first and said second dielectric spacers, and wherein said second dielectric layer is above said gap in between said first and said dielectric spacers, wherein the dielectric constant of said first and said second dielectric spacers is greater than the dielectric constant of said first and said second dielectric layers, and wherein the dielectric constant of said first and said second dielectric layers is greater than the dielectric constant of said gap.

2. The structure of claim 1 wherein said gap is comprised of air.

3. The structure of claim 1 wherein said first and said second dielectric spacers are comprised of silicon nitride, silicon carbide, nitrogen-doped silicon carbide, oxygen-doped silicon carbide, boron-doped carbon nitride or boron-doped silicon carbide, wherein said first and said second dielectric layers are comprised of silicon dioxide, a silicate, or a carbon-doped oxide with 0-10% porosity, and wherein said gap is comprised of a carbon-doped oxide with 25-40% porosity or air.

4. The structure of claim 1 wherein the width of said first and said second dielectric spacers is substantially equal to the width of said gap.

5. The structure of claim 4 wherein the width of said first and said second dielectric spacers is in the range of 5-20 nanometers.

6. The structure of claim 1 further comprising:
   a via, wherein at least a portion of said via is in said second dielectric layer, wherein said via is on a portion of the top surface of said first interconnect, and wherein said via is on a portion of the top surface of said first dielectric spacer.

7. An electronic structure with a plurality of interconnects, comprising:
   a first dielectric layer;
   a first interconnect, wherein said first interconnect is above said first dielectric layer;
   a second interconnect, wherein said second interconnect is above said first dielectric layer, wherein said second interconnect is spaced apart from said first interconnect, and wherein said second interconnect is a dummy interconnect;
   a first dielectric spacer, wherein said first dielectric spacer is adjacent to a sidewall of said first interconnect, wherein said first dielectric spacer is in between said first and said second interconnects, and wherein said first dielectric spacer tapers outward, away from said sidewall of said first interconnect, from the top of said first interconnect to the bottom of said first interconnect;
   a second dielectric spacer, wherein said second dielectric spacer is adjacent to a first sidewall of said second interconnect, wherein said second dielectric spacer is in between said first and said second interconnects, wherein said second dielectric spacer tapers outward, away from said first sidewall of said second interconnect, from the top of said second interconnect to the bottom of said second interconnect, and wherein said first and said second dielectric spacers are discontiguous from one another with a first gap in between said first and said second dielectric spacers;
   a third interconnect, wherein said third interconnect is above said first dielectric layer, and wherein said third interconnect is spaced apart from said second interconnect;
   a third dielectric spacer, wherein said third dielectric spacer is adjacent to a second sidewall of said second interconnect, wherein said third dielectric spacer is in between said second and said third interconnects, and wherein said third dielectric spacer tapers outward, away from said second sidewall of said second interconnect, from the top of said second interconnect to the bottom of said second interconnect;
   a fourth dielectric spacer, wherein said fourth dielectric spacer is adjacent to a sidewall of said third interconnect, wherein said fourth dielectric spacer is in between said second and said third interconnects, wherein said fourth dielectric spacer tapers outward, away from said sidewall of said third interconnect, from the top of said third interconnect to the bottom of said third interconnect, wherein said third and said fourth dielectric spacers are discontiguous from one another with a second gap in between said third and said fourth dielectric spacers, and wherein the width of said second gap is substantially equal to the width of said first gap in between said first and said second dielectric spacers;

a second dielectric layer, wherein said second dielectric layer is above said first, said second and said third interconnects, wherein said second dielectric layer is above said first gap in between said first and said second dielectric spacers, wherein said second dielectric layer is above said second gap in between said third and said fourth dielectric spacers, and wherein said second dielectric layer is above said first, said second, said third and said fourth dielectric spacers, wherein the dielectric constant of said first, said second, said third and said fourth dielectric spacers is greater than the dielectric constant of said first and said second dielectric layers, and wherein the dielectric constant of said first and said second dielectric layers is greater than the dielectric constant of said first and said second gaps.

8. The structure of claim 7 wherein said first and said second gaps are comprised of air.

9. The structure of claim 7 wherein said first, said second, said third and said fourth dielectric spacers are comprised of silicon nitride, silicon carbide, nitrogen-doped silicon carbide, oxygen-doped silicon carbide, boron-doped carbon nitride or boron-doped silicon carbide, wherein said first and said second dielectric layers are comprised of silicon dioxide, a silicate, or a carbon-doped oxide with 0-10% porosity, and wherein said first and said second gaps are comprised of a carbon-doped oxide with 25-40% porosity or air.

10. The structure of claim 7 wherein the width of said first and said second dielectric spacers is substantially equal to the width of said first gap, and wherein the width of said third and said fourth dielectric spacers is substantially equal to the width of said second gap.

11. The structure of claim 10 wherein the width of said first, said second, said third and said fourth dielectric spacers is in the range of 5-20 nanometers.

12. The structure of claim 7 further comprising:
a via, wherein at least a portion of said via is in said second dielectric layer, wherein said via is on a portion of the top surface of said first interconnect, and wherein said via is on a portion of the top surface of said first dielectric spacer.

13. An electronic structure with a plurality of interconnects, comprising:
a first dielectric layer;
a first interconnect, wherein said first interconnect is above said first dielectric layer;
a second interconnect, wherein said second interconnect is above said first dielectric layer, wherein said second interconnect is spaced apart from said first interconnect, and wherein said first and said second interconnects are recessed into said first dielectric layer;
a first dielectric spacer, wherein said first dielectric spacer is adjacent to a sidewall of said first interconnect, and wherein said first dielectric spacer is in between said first and said second interconnects;
a second dielectric spacer, wherein said second dielectric spacer is adjacent to a sidewall of said second interconnect, wherein said second dielectric spacer is in between said first and said second interconnects, and wherein said first and said second dielectric spacers are discontiguous from one another with a gap in between said first and said second dielectric spacers; and
a second dielectric layer, wherein said second dielectric layer is above said first and said second interconnects, wherein said second dielectric layer is above said first and said second dielectric spacers, and wherein said second dielectric layer is above said gap in between said first and said dielectric spacers, wherein the dielectric constant of said first and said second dielectric spacers is greater than the dielectric constant of said first and said second dielectric layers, and wherein the dielectric constant of said first and said second dielectric layers is greater than the dielectric constant of said gap.

14. The structure of claim 13 wherein said gap is comprised of air.

15. The structure of claim 13 wherein said first and said second dielectric spacers are comprised of silicon nitride, silicon carbide, nitrogen-doped silicon carbide, oxygen-doped silicon carbide, boron-doped carbon nitride or boron-doped silicon carbide, wherein said first and said second dielectric layers are comprised of silicon dioxide, a silicate, or a carbon-doped oxide with 0-10% porosity, and wherein said gap is comprised of a carbon-doped oxide with 25-40% porosity or air.

16. The structure of claim 13 wherein the width of said first and said second dielectric spacers is substantially equal to the width of said gap.

17. The structure of claim 16 wherein the width of said first and said second dielectric spacers is in the range of 5-20 nanometers.

18. The structure of claim 13 further comprising:
a via, wherein at least a portion of said via is in said second dielectric layer, wherein said via is on a portion of the top surface of said first interconnect, and wherein
said via is on a portion of the top surface of said first dielectric spacer.

* * * * *